(12) United States Patent
Montero et al.

(10) Patent No.: US 6,573,671 B2
(45) Date of Patent: Jun. 3, 2003

(54) FAN RELIABILITY

(75) Inventors: Adolfo S. Montero, Austin, TX (US); Hasnain Shabbir, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 21 days.

(21) Appl. No.: 09/905,485

(22) Filed: Jul. 13, 2001

(65) Prior Publication Data

US 2003/0015983 A1 Jan. 23, 2003

(51) Int. Cl.⁷ ................................................ H02P 5/46
(52) U.S. Cl. .............................. 318/53; 318/59; 318/66; 318/471
(58) Field of Search .............................. 318/34, 41, 51, 318/53, 59, 66, 68, 69, 77, 105, 112, 471; 310/62, 63; 388/934

(56) References Cited

U.S. PATENT DOCUMENTS

| | | | |
|---|---|---|---|
| 5,168,424 A | 12/1992 | Bolton et al. | 361/384 |
| 5,490,557 A * | 2/1996 | Taylor | |
| 5,546,272 A | 8/1996 | Moss et al. | 361/687 |
| 5,687,079 A | 11/1997 | Bauer et al. | 364/175 |
| 6,268,664 B1 * | 7/2001 | Rolls et al. | 307/32 |
| 6,368,064 B1 * | 4/2002 | Bendikas et al. | 417/2 |
| 6,396,688 B1 * | 5/2002 | Davies et al. | 361/687 |

* cited by examiner

*Primary Examiner*—Bentsu Ro
(74) *Attorney, Agent, or Firm*—Baker Botts L.L.P.

(57) ABSTRACT

A computer system or other electronic system includes a plurality of cooling fans configured to operate in parallel. The cooling fans are operated in a manner to decrease the operating time of a fan. The cooling fans can alternate in operation. Thus, operating time is more equally divided between the two cooling fans and the hours of operation and number of rotations of the fans is more nearly equal. In an embodiment to reduce noise, two fans run at a lower speed instead of one fan at a higher speed. In an embodiment, a fan operates with a reduced speed which maintains a desired operating temperature. In an embodiment a thermal table is stored in BIOS (basic/input output system).

26 Claims, 7 Drawing Sheets

FAN RELIABILITY

BACKGROUND OF THE INVENTION

1. Field of the Invention

The present invention relates to the field of improving the reliability of a computer or other electronic system. More specifically, the present invention relates to alternating operation of cooling fans to improve reliability of the fans and the system.

2. Description of the Related Art

Computer systems are information handling electronic systems which can be designed to give independent computing power to one user or a plurality of users. Computer systems may be found in many forms including, for example, mainframes, minicomputers, workstations, servers, personal computers, internet terminals, and notebooks. Computer systems include desk top, floor standing, rack mounted, or portable versions. A typical computer system includes at least one system processor, associated memory and control logic, and a number of peripheral devices that provide input and output for the system. Such peripheral devices may include display monitors, keyboards, mouse-type input devices, floppy and hard disk drives, CD-ROM drives, printers, network capability cards, terminal devices, modems, televisions, sound devices, voice recognition devices, electronic pen devices, and mass storage devices such as tape drives, CD-R drives, or DVDs.

Compared to currently manufactured desk top and laptop computers, early computers consumed relatively little power and relied on convective cooling. Convective cooling allows components to dissipate heat through contact with ambient air. However ambient air is not a particularly efficient conductor of heat. Ambient air can become trapped within a computer casing and act as an insulator instead of a conductor. Trapped ambient air acting as an insulator can increase the operating temperature of a computer. Thus, later computers included fans to draw air from the atmosphere and direct the air into the computer enclosure.

Computer systems continue to increase in operating speed and decrease in size. As operating frequencies increase power consumption also increases. Increased power consumption increases heat generated. An increase in heat generated increases operating temperatures, particularly of the central processing unit (cpu). As computer systems decrease in size the heat generated is confined to a smaller space. Therefore, in smaller faster systems such as laptops, more heat is confined to a smaller space. Confining more heat to a smaller space causes much higher surface temperatures of all components, particularly the heat generating components.

Dissipation of heat through convection or other means allows internal components to remain within their normal operating temperature range. For the reasons described in the preceding paragraph, ambient convection is frequently insufficient to provide sufficient cooling. However, air moving across the surface of a component raises the convective heat transfer coefficient for the surface of the component. Increasing the convective heat transfer coefficient for a component increases the heat transfer from the component to the atmosphere and decreases the temperature of the component. Therefore, designers and manufacturers turn to forced convection (also referred to as "forced air cooling") to provide sufficient cooling capacity.

A cpu consumes more electrical power than any other component in a conventional desktop or laptop computer. A significant portion of the electrical power consumed by the cpu is dissipated as heat during operation of the computer. Thus, the cpu tends to produce more heat than any other component within a computer system. A heat sink can be provided to increase the area of the cpu available for convective cooling and to redce the thermal resistance between the cpu and the ambient environment. Convective cooling enhanced by a heat sink may be sufficient in limited operating conditions. More generally, at least one dedicated cooling fan is provided to force ambient air across a cpu surface. In many cases another cooling fan is provided to move air across the surface of other components within the computer chassis.

Providing multiple fans introduces problems into the operation of a computer system. In many cases the operating life of a cooling fan is less than the projected operating life of the computer system. Providing multiple fans increases the probability of failure of a single fan. Failure of a fan can lead to failure of the computer system and decreased customer satisfaction.

U.S. Pat. No. 5,168,424 to Bolton et al. titled "Multi Unit Electrical Apparatus with Dual Inlet Fan Positioned Opposite Unit Bays" (also referred to as "Bolton") teaches an electrical system having fans which can be dedicated to various components within the system. However, Bolton does not teach multiple fans dedicated to one component.

Multiple fans can also increase operating noise of a system. When both fans are operating they may interact, in some cases even operating at resonant frequency. Increased noise causes distraction and also causes decreased customer satisfaction. Multiple fans operating simultaneously can be cooling a component which requires cooling from only one fan, thus increasing manufacturing cost without benefit.

U.S. Pat. No. 5,687,079 to Bauer et al. titled "Method and Apparatus for Improved Control of Computer Cooling Fan Speed" (also referred to as "Moss") teaches controlling fan speeds to prevent audible noise from being produced by the fans. However, Bauer does not teach alternating operation of cooling fans. Nor does Bauer teach controlling fan speeds in response to cpu temperature or internal temperature of a computer system.

U.S. Pat. No. 5,546,272 to Moss et al. titled "Serial Fan Cooling Subsystem for Computer Systems" (also referred to as "Moss") teaches using fans in series to cool components of a computer system. However, Moss does not teach alternating operation of the fans to increase fan reliability. Nor does Moss teach varying the speed of a fan to increase fan reliability or to reduce noise.

U.S. patent application Ser. No. 09/537,159 filed on Mar. 29, 2000 listing Stephen J. Davies, Jil M. Bobbitt and Jason D. Tunnell as inventors, titled "Series Fan Speed Control System," now U.S. Pat. Ser. No. 6,396,688 (also referred to as "Davies") again teaches cooling a computer component using fans in series. Davies also teaches switching from one fan to another if a fan fails. However, Davies teaches two fans operating in series, not in parallel. However, in a series configuration if one fan fails the remaining fan must pull air through or push air past the disabled fan. Nor does Davies teach alternating fans to increase operating reliability of the system. Nor does Davies teach controlling fan speed to increase system reliability or reduce noise.

SUMMARY OF THE INVENTION

In accordance with the present disclosure an apparatus and a method are taught to increase the reliability of a computer system or other electronic system. A computer system includes a plurality of cooling fans configured to operate in parallel. The cooling fans are operated in a manner to increase the reliability of the fans. Thus the fans have an extended life. The increased life of the cooling fans increases the reliability of the system.

The cooling fans are operated in a manner to decrease the operating time of a fan. The cooling fans can alternate in operation. Thus, operating time is more equally divided between the two cooling fans and the hours of operation and number of rotations of the fans is more nearly equal. In an embodiment, a fan operates with a reduced speed which maintains a desired operating temperature. In an embodiment to reduce noise, two fans run at a lower speed instead of one fan at a higher speed. In an embodiment a thermal table is stored in BIOS (basic/input output system).

The foregoing is a summary and this contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The following sets forth a detailed description of a mode for carrying out the invention. The description is intended to be illustrative of the invention and should not be taken to be limiting. The disclosure describes a computer system including at least two fans configured to operate in parallel. Cooling air from the fans can be dedicated to cooling a single component, such as a cpu. The operation of the fans is controlled to increase the operating life of the computer system. Increasing the operating life of the computer system is accomplished by reducing the operating time of a fan. In many cases, one fan starts first during each cycle. In the prior art, one fan will accumulate the most operating hours and typically will fail before any other fan. According to one embodiment, the operation of the fans will alternate. Alternating operating the fans will preclude one fan from accumulating a disproportionate number of operating hours and failing prematurely.

In an embodiment further described in FIG. 1 (below), a computer system has two fans; fan A and fan B. In normal operation one fan, for example fan A, can operate until it has provided sufficient cooling and it is no longer needed. When it is no longer needed, fan A can be turned off. In earlier computer systems, when additional cooling was required, the same fan, fan A, would again be started. In this scenario fan B would only be used if fan A did not provide sufficient cooling. Thus, under earlier operational configurations fan B could be expected to operate less often than fan A. Thus, fan A would be expected to accumulate more operating hours than fan B and thus fan A would be expected to fail before fan B.

According to one enablement of the invention, a temperature sensor monitors the cpu temperature. If no fan is operating and the temperature of the cpu increases above a predetermined point, a signal is generated to start operation of a fan. In the exemplary operational configuration described by this disclosure, the signal will start fan A or fan B alternately. Thus, fan B can start and be operated alone, unless fan A is needed for additional cooling. Thus, the time of operation of each fan can be reduced over the life of the computer, extending the life of each fan. In some circumstances operation of both fans may not be necessary to provide sufficient cooling. Another enablement of the invention contemplates reducing the operating speed of a fan to extend the operating life of the fan.

For example, in an environment having a low ambient temperature, one fan may have the capacity to provide sufficient cooling air. To accommodate various operating conditions, the speed of a single fan (or pair of fans) may increase or decrease. In one embodiment, the operating speed of a fan can be controlled depending on the temperature of the cpu. Decreasing the average operating speed of each fan decreases the revolutions of each fan during a specific period of time. Decreasing the total revolutions of each fan for a given time increases the operating life of each fan. In yet another embodiment, the number of fans operating can be controlled to satisfy cooling or noise requirements.

If only one fan is operating and the temperature of the cpu continues to increase, the invention contemplates various alternatives. In one approach, illustrated in Table 1 below, the speed of the operating fan is increased. In this scenario, if increasing the speed of the operating fan does not stabilize or reduce the cpu temperature, the speed of the operating fan can again be increased. Alternatively, the second fan can be started. Speed and operation of each fan can be controlled in accordance with an algorithm stored in system BIOS (basic input/output operating system). The algorithm can be instantiated in a number of suitable means, including a table. For example, Table 1, Table 2 and Table 3 below, provide examples of a BIOS thermal table.

Figure 1:
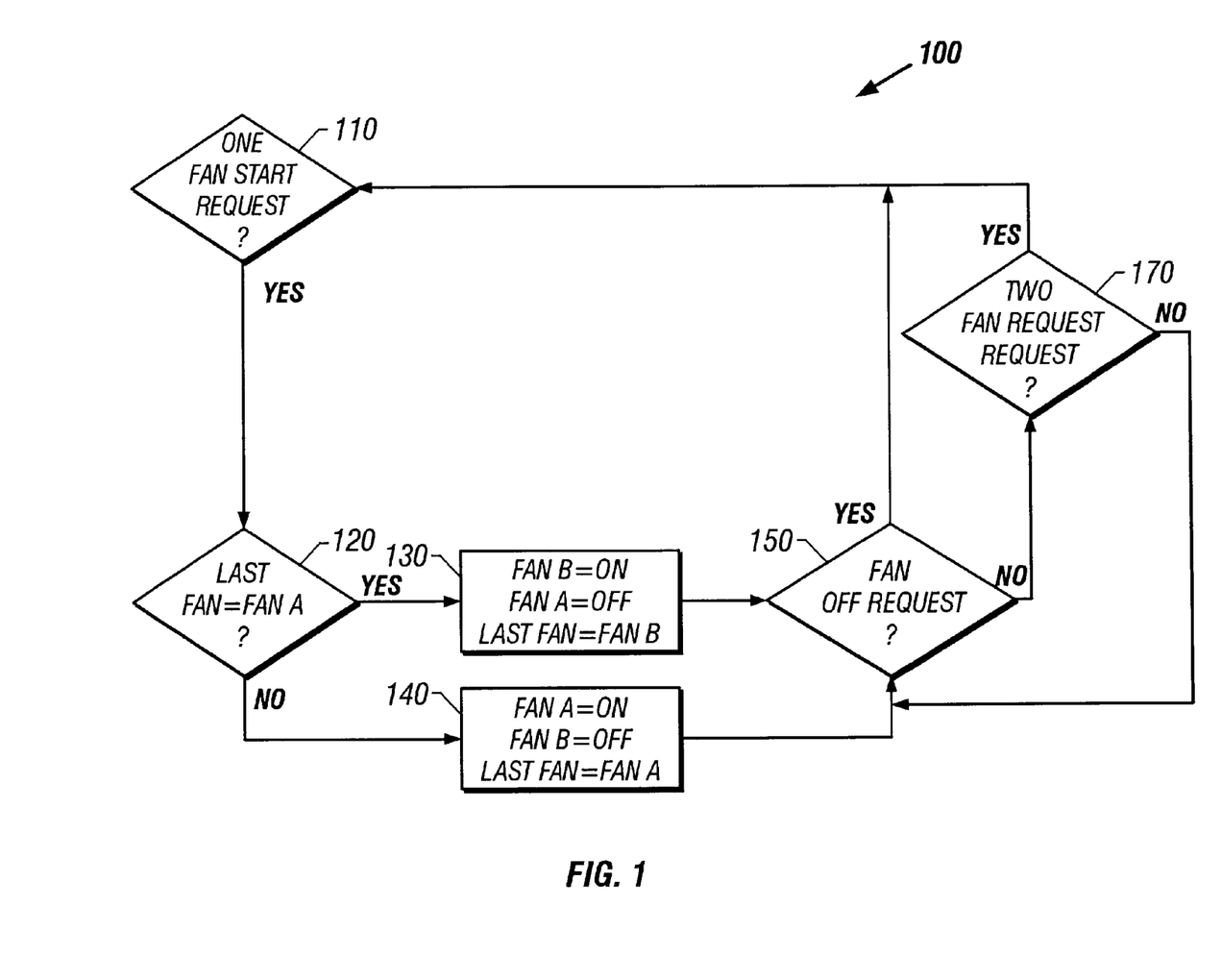
FIG. 1 shows a flow diagram of a logical sequence to alternate operation of two cooling fans.

Referring to FIG. 1, a sequence is illustrated in which only one fan operates at a time. This sequence can begin a circuit or other device initiates a start request for a fan. This instruction corresponds to one fan start request 100 as represented in FIG. 1. If a fan start request is received, the logical sequence proceeds to decision 120, last fan =fan A. (If a fan start request is not received then the logical sequence proceeds to logical event 150, fan off request.) In decision 120 the last fan operating is identified. If the last fan operating was fan A then the process continues to logical event 130. In logical event 130, a signal is generated to start fan B. Thus, the operation of fan A and fan B are alternated, and the operating time of each of the fans is consequently reduced.

If logical decision 120 determines the last fan operating was fan B, then the process continues to logical step 140. In logical step 140 a signal is generated to start fan A. Thus, again the operation of fan A and fan B are alternated, and the operating hours of each of the fans is reduced. From logical step 140 (and logical step 130 described in the preceding paragraph) the process continues to logical step 150, fan off request. Fan off request 150 issues a stop command to either operating fan, fan A or fan B. From logical step 150 the process continues to logical step 110, initially chosen as the beginning point.

Figure 2A:
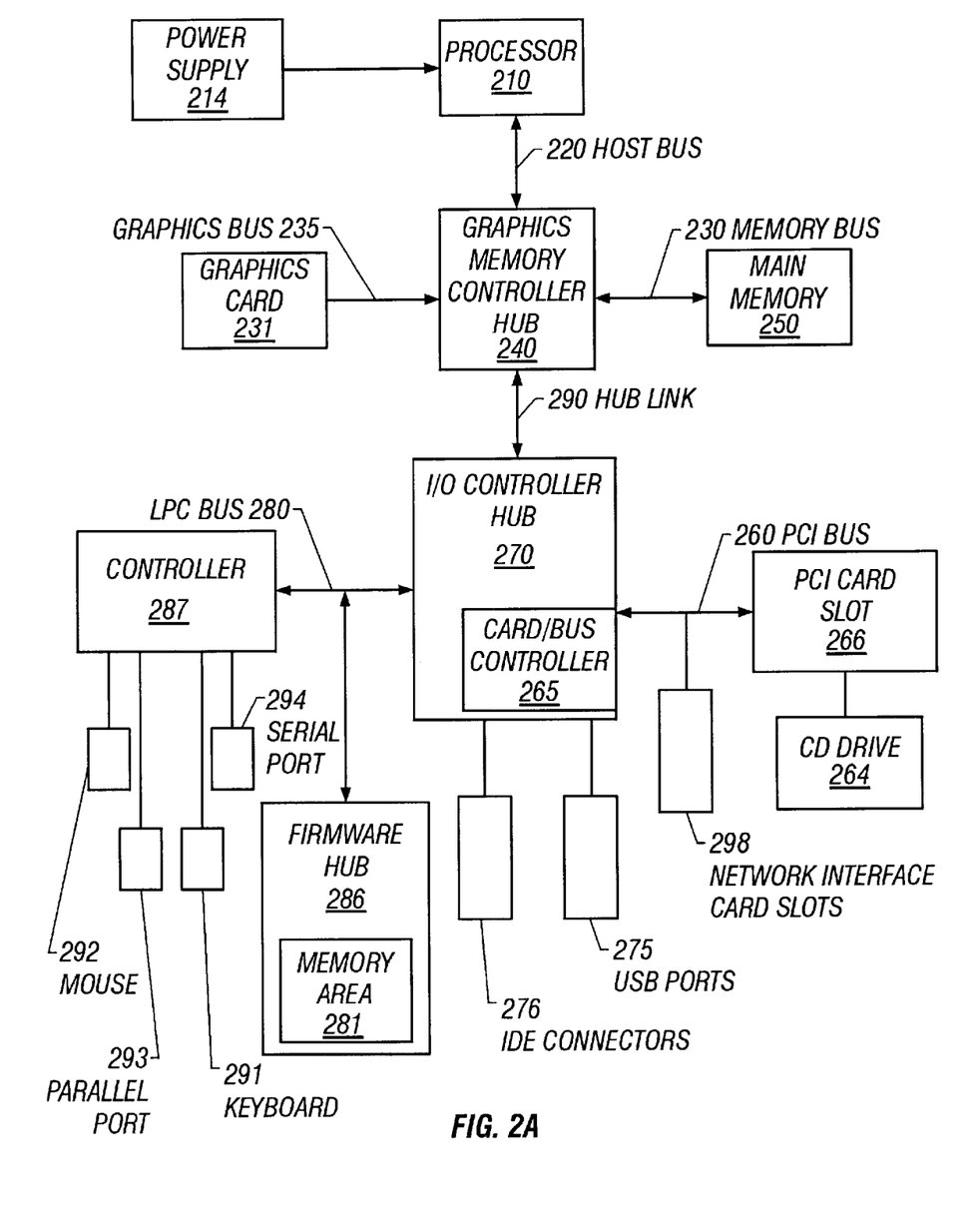
FIG. 2A is a block diagram of one example of a computer system according to the present invention.

FIG. 2A is a block diagram of an exemplary computer system 200 that may be found in many forms, including, e.g., mainframes, minicomputers, workstations, servers, personal computers, internet terminals, notebooks, and embedded systems. Personal computer ("PC") systems, such as those compatible with the x86 configuration, include desktop, floor standing, or portable versions. Exemplary computer system 200 includes a computer system hardware unit that further includes a central processing unit (sometimes referred to simply as processor") 210, associated main memory 250, and a number of peripheral devices that provide I/O for the system 200, and computer system software that runs on the hardware unit. Exemplary computer system 200 is powered by a power supply 214. Power supply 214 can include a voltage regulator, not shown.

Peripheral devices often include keyboards 291, mouse-type input devices 292, CD drive 264, and others not shown, including monitors, floppy and hard disk drives, modems, printers, terminal devices, televisions, sound devices, voice recognition devices, electronic pen devices, and mass storage devices such as tape drives or digital video disks ("DVDs"). The peripheral devices usually communicate with the processor over one or more peripheral component interconnect ("PCI") slots 266, universal serial bus ("USB") ports 275, or integrated device electronics ("IDE") connectors 276. The PCI slots 266 may use a card/bus controller 265 to connect to one or more buses such as host bus 220, PCI bus 260, and low pin count ("LPC") bus 280, with the buses communicating with each other through the use of one or more hubs such as graphics controller memory hub 240 and I/O controller hub 270. Typical systems such as exemplary system 200 often include network interface cabling slots 298 to accommodate network cards that mediate between the computer and the physical media over which transmissions to and from system 200 travel. USB ports 275 and IDE connectors 276 may connect to one or more of the hubs 240, 270. The hubs may communicate with each other through the use of one or more links such as hub link 290.

Many I/O devices can also be accommodated by parallel port 293 and serial port 294 that are also coupled to controller 287 that is in turn coupled to a LPC bus 280. In one enablement of a exemplary computer system 200, controller 287 can be referred to as LPC controller 287. Typical computer systems often include a graphics card 231 coupled to a graphics memory controller hub 240 by a graphics bus 235 and a main memory 250 coupled to a graphics memory controller hub 240 by a memory bus 230. Finally, a typical computer system also includes software modules known as BIOS code. BIOS code is either copied from an external medium such as a CD to, or stored on, the memory area 281 in firmware hub 286.

Figure 2B:
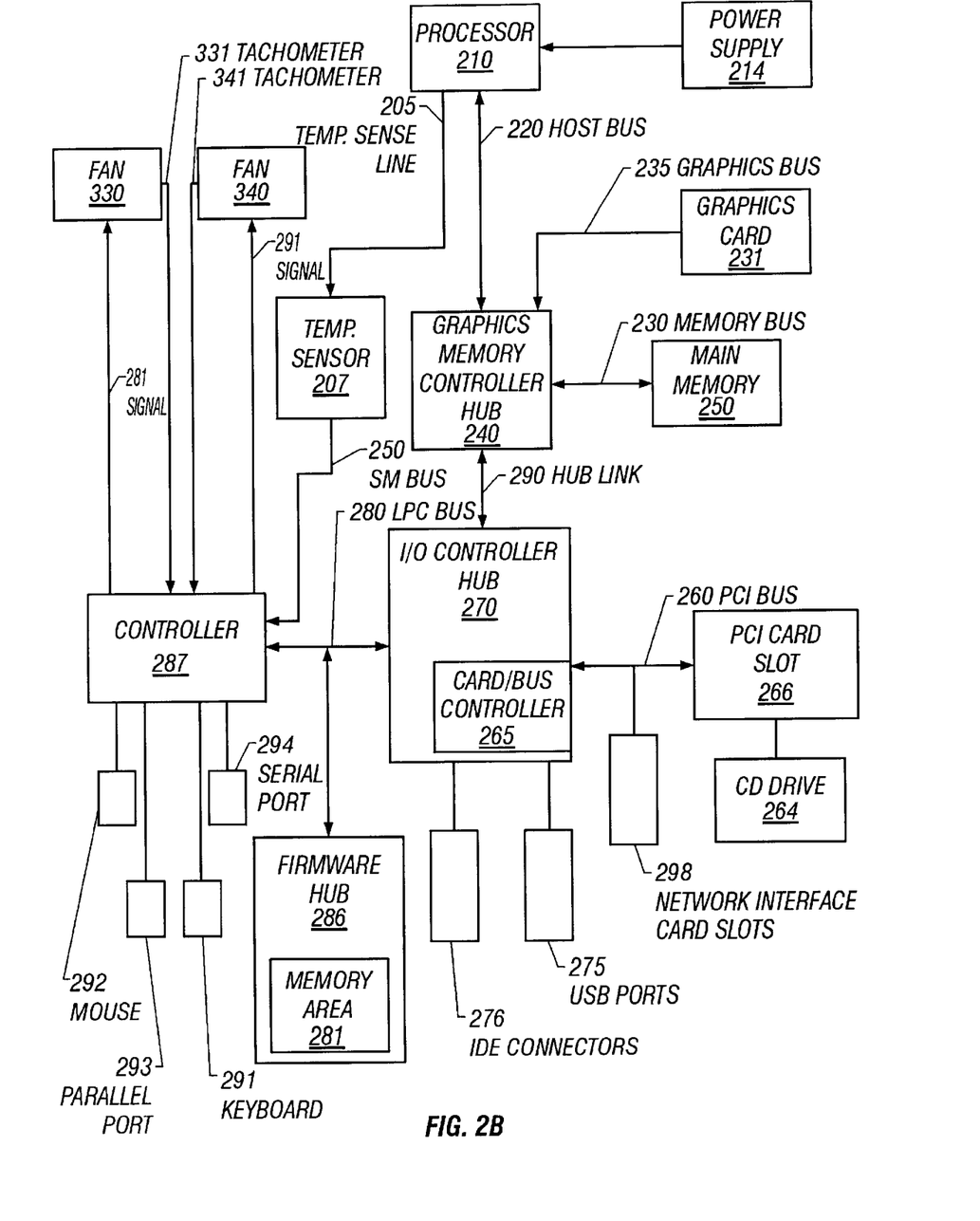
FIG. 2B is a block diagram of the computer system as shown in FIG. 2A according to one embodiment of the disclosure.

Referring to FIG. 2B, in one embodiment fan 330 and fan 340 can be installed in a computer system as shown. An example of a fan suitable for this application include part number GM0503PEB1-8 L2.M as provided by Sunon of Taiwan. (For more information on the manufacturer refer to website www.Sunon.com.) Fan 330 receives a control signal 281, and fan 340 receives a control signal 291 from controller 287 as shown.

FIG. 2B is a line diagram of a circuit that controls two fans in an operational configuration to increase the reliability of the computer system. Temperature sensor 207 detects the surface temperature signal of processor 210 via sense line 205. In one embodiment, temperature sensor 207 translates the analog signal into a digital signal representing temperature. Temperature sensor 207 can transmit the digital temperature data signal to controller 287 via SM bus 230. An example of a temperature sensor suitable for this application is part number ADI 1032, available from Analog Devices, Inc. of Norwood, Mass.)

In one embodiment, the cpu has an internal temperature sensor. The internal cpu temperature can be detected by (external) temperature sensor 207. In one embodiment the external sensor converts the temperature signal received from the cpu from analog to digital.

Controller 287 can issue start signals to fan 330 and fan 340 via signals 281 and 291. In an embodiment, tachometer 331 and 341 can communicate speed signals from fan 330 and fan 340 respectively, to controller 287. In an embodiment, controller 287 can use the speed of fan 330 and 340 as input to a logic sequence (such as the logic sequence shown in FIG. 1) to control fan 330 and fan 340.

The start signal generated by controller 287 can be derived from information stored in a temperature table. A temperature table can be stored in a memory of a computer system, such as memory area 281 of exemplary computer systems 200 or 202. The temperature table can control signal 281 and signal 291 to start fan 330 and 340 alternately. As shown in Tables 1, 2 and 3 below, the temperature table can modify signal 281 and signal 291 to control the fan speed of fan 330 and 340. In Tables 1, 2 and 3 it is intended that fan 330 and fan 340 alternate operation. Thus when used in Table 1, 2 or 3 below, "fan A" can refer to either fan 330 or fan 340 and "fan B" can refer to either fan 330 or fan 340.

TABLE 1

| Fan A Status | Fan B Status | Temperature |
| --- | --- | --- |
| Off | Off | 72° F. falling |
| Low | Off | 72° F. rising/62° F. falling |
| Medium | Off | 82° F. rising/65° F. falling |
| High | High | 92° F. rising/70° F. falling |
| Shutdown | Shutdown | 96° F. |

Under the operational configuration as contemplated by Table 1, when the cpu temperature is less than 72° F., both fans are off. When the cpu temperature rises above 72° F., fan A begins operating at a low speed. If the cpu temperature again increases and rises above 82° F., fan A begins to operate at a medium speed. If the cpu temperature rises above 92° F., fan A increases speed and operates at high speed. Fan B also begins to operate and operates at high speed. According to the configuration described in Table 1 if the temperature of the cpu rises above 96° F. the computer system shuts down. Shutting down the computer system limits damage to the computer system from localized hot spots caused by insufficient cooling. However, Table 1 is an example and is not limiting. Neither the temperatures listed nor the fan status is fixed. Temperature and fan status can be changed according to system or other requirements.

Table 1 also represents a configuration of operation of the fans as the temperature of the cpu is falling. For example, if both fans are operating at high speed and the temperature of the cpu can, in some circumstances begin to decrease. In this configuration if the cooling air provided by the fans operating at high speed exceeds the volume of air required to reduce the temperature of the cpu, the temperature of the cpu can begin to decrease (depending on cpu power requirements and other variables). In this configuration if the temperature of the cpu falls below 70° F., fan B can be shutdown and the speed of fan A can be reduced from high to medium.

Similarly, if the temperature of the cpu is 80° F. and if fan A is operating at medium speed the temperature of the cpu in some circumstance can decrease. When the temperature of the cpu decreases from 80° F. below 65° F., the operating speed of fan A will decrease from medium to low as represented by Table 1, above. Other fan speeds and operational configurations are given in Table 1 for other ranges of falling temperatures.

In another example, Table 2 below provides an alternate BIOS thermal table. Table 2 illustrates that both fan life and fan operating noise can be considered when constructing a bios thermal table. For example, Table 1 and Table 2 provide different operating configurations if the operating temperature of the cpu rises above 82° F. In the configuration described in Table 1, if the temperature of the cpu rose above 82° F., fan A would operate at a medium speed. However one fan, fan A, operating at high speed may produce more noise than two fans operating at low speed. Thus Table 2 provides an alternate operating configuration than Table 1 to reduce noise.

In the configuration described in Table 2, if the operating temperature of the cpu rises above 82° F., fan A and fan B both begin operate at low speed. In this configuration the simultaneous operation of fan A and fan B at low speed is intended to reduce the total noise produced by both fans and thus reduce consumer dissatisfaction. Again, Table 2 is not limiting. Configurations other than the configuration described in Table 2 are possible to reduce operating noise.

TABLE 2

| Fan A Status | Fan B Status | Temperature |
| --- | --- | --- |
| Off | Off | 72° F. falling |
| Low | Off | 72° F. rising/62° F. falling |
| Low | Low | 82° F. rising/65° F. falling |
| High | High | 92° F. rising/70° F. falling |
| Shutdown | Shutdown | 96° F.° |

Any configuration of a thermal table to reduce operating noise of the fans is within the spirit and scope of an enablement. Another example of an embodiment of a temperature table is given below in Table 3.

As shown in Table 3 (below) a thermal table can perform other functions. An example of a function which can be performed by the thermal table is to reduce the operating frequency of the cpu. Reducing the operating frequency of the cpu can reduce the power consumed by the cpu. Reducing the power consumed by the cpu reduces heat generated which is expected to reduce surface temperature.

TABLE 3

| Fan A Status | Fan B Status | Temperature |
| --- | --- | --- |
| Off | Off | 72° F. falling |
| Low | Off | 72° F. rising/62° F. falling |
| Medium | Off | 82° F. rising/65° F. falling |
| High | High | 92° F. rising/70° F. falling |
| High; throttle 25% | High; throttle 25% | 96° F. rising/90° F. falling |

TABLE 3-continued

| Fan A Status | Fan B Status | Temperature |
| --- | --- | --- |
| High; throttle 50% | High; throttle 50% | 99° F. rising/92° F. falling |
| Shutdown | Shutdown | 102° F.° |

In the temperature region below 92° F., Table 3 is similar to Table 1. Above 92° F. Table 3 provides information upon which to generate a signal to reduce the operating frequency of the cpu. More specifically, if the operating temperature of the cpu is 92° F. and both fans (fan A and fan B) are operating at full speed no excess fan cooling capacitiy is available. In this scenario if the temperature of the cpu continues to increase and exceeds 96° F. the operating frequency of the cpu is decreased by 25%. Similarly, if the cpu temperature continues to increase and exceeds 99° F. the operating frequency of the cpu is again decreased to 50%. Still referring to Table 3, if the operating frequency of the cpu has been decreased to 50% and if the temperature of the cpu begins to decrease and falls from above 99° F. to below 96° F. then the operating speed of the cpu will increase from 50% to 75%.

Again, Table 3 is illustrative and is not limiting. Neither the operational configurations nor the corresponding temperatures shown in Table 3 are limiting. Tables 1, 2 and 3 are provided as examples only. A temperature table such as Table 1, Table 2 or Table 3 can operate in conjunction with a software module to alternate operation of the fans as described previously (refer to FIG. 1).

As shown previously (refer to Table 1, Table 2 and Table 3) the manner in which the operation of fan 330 and 340 can be controlled is not limited. In the manner described the operating speed and operating time of fan 330 and fan 340 can be reduced thus increasing the reliability of the fans and the computer (or other electronic) system can be increased.

Figure 4:
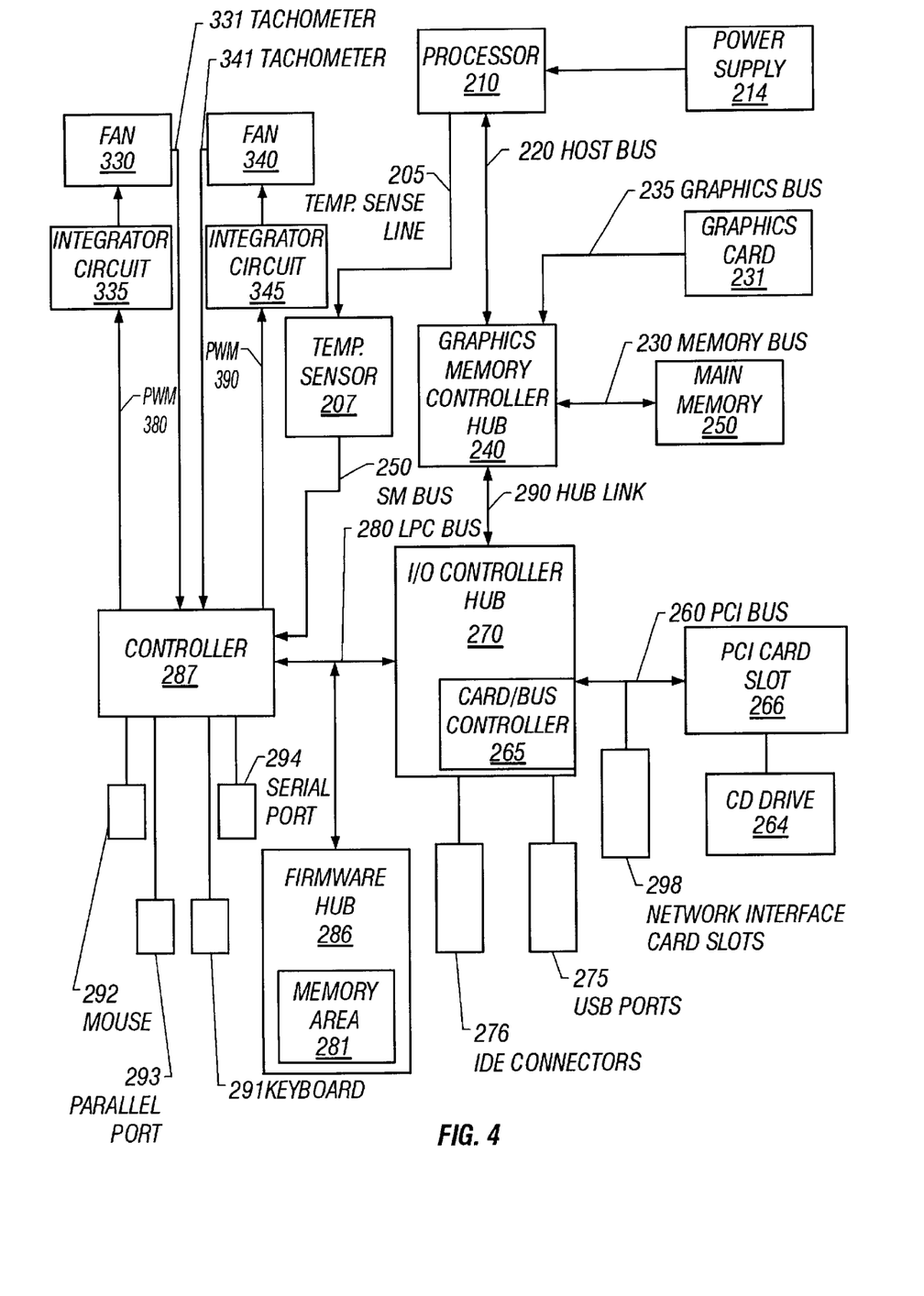
FIG. 4 is a block diagram of one example of a computer system, such as the exemplary computer system shown in FIG. 2A, enabling the feature of the disclosure previously shown in FIG. 3.

FIG. 4 shows a line diagram of a circuit which can control two fans in an operational configuration, such as an operational configuration described in a temperature table. Temperature sensor 207 detects the surface temperature of processor 210 via sense line 205. Temperature sensor 207 and translates the analog signal into a digital signal representing temperature. Temperature sensor 207 the digital temperature data signal to controller 287 via SM bus 230. Controller 287 can transmit the temperature via LPC bus 280 to hub link 290 and host bus 220 to processor 210.

In the embodiment shown in FIG. 4, integrator circuit 335 and integrator circuit 345 receive pwm signal 380 and pwm signal 390 from controller 287 which receives a temperature signal from temperature sensor 207 (as previously shown in FIG. 2B). Controller 287 receives tachometer signals 331 and 341 (also referred to as speed signals) from fan 330 and fan 340. Fan 330 and fan 340 receive analog signals from integrator circuit 335 and integrator circuit 345.

Still referring to FIG. 4, integrator circuit 335 and integrator circuit 345 receive digital pulse width modulation signals ("pwm") 380 and 390 from controller 287 as shown in FIG. 2B. Integrator circuit 335 and integrator circuit 345 translate the digital pwm signals to analog format. The analog signal (typically zero to five volts) is used as a power supply to fan 330 and to fan 340. The analog signal provides speed control by varying the amplitude of the signal. In one embodiment a temperature table, (such as Table 1, 2 or 3 shown previously) defines pwm signals which the integrator circuit translates to an analog voltage signal. A temperature table can be stored in the memory of a computer system, such as exemplary computer system 200. In an embodiment, the temperature table can modify pwm 380 and pwm 390 to start fan 330 and 340 alternately. Similarly, the temperature table can modify pwm 380 and 390 to control the fan speed of fan 330 and 340.

Figure 3:
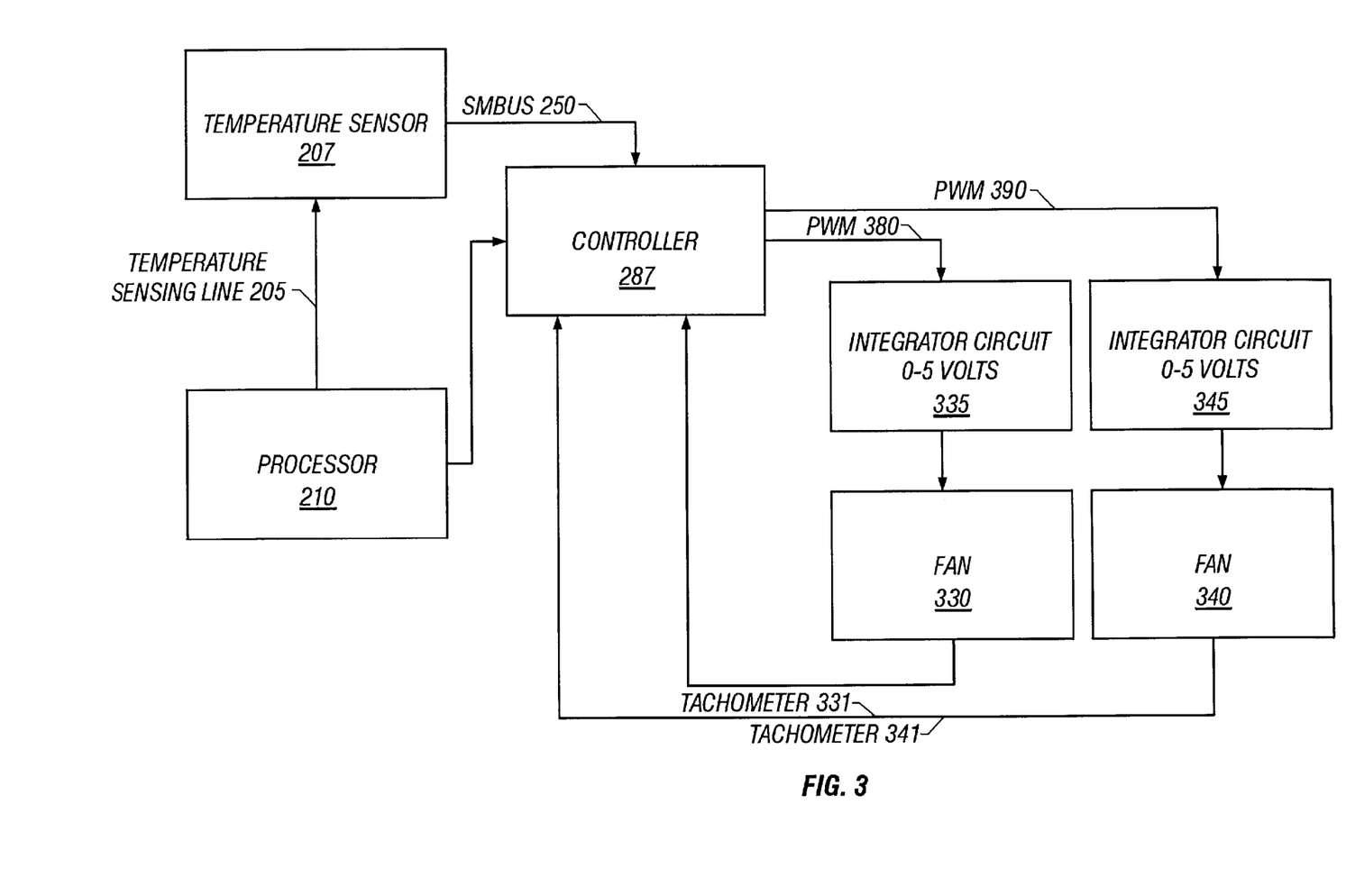
FIG. 3 shows a line diagram of a circuit to operate two cooling fans in a computer system such as the exemplary computer system shown previously in FIG. 2A and FIG. 2B.
Figure 5A:
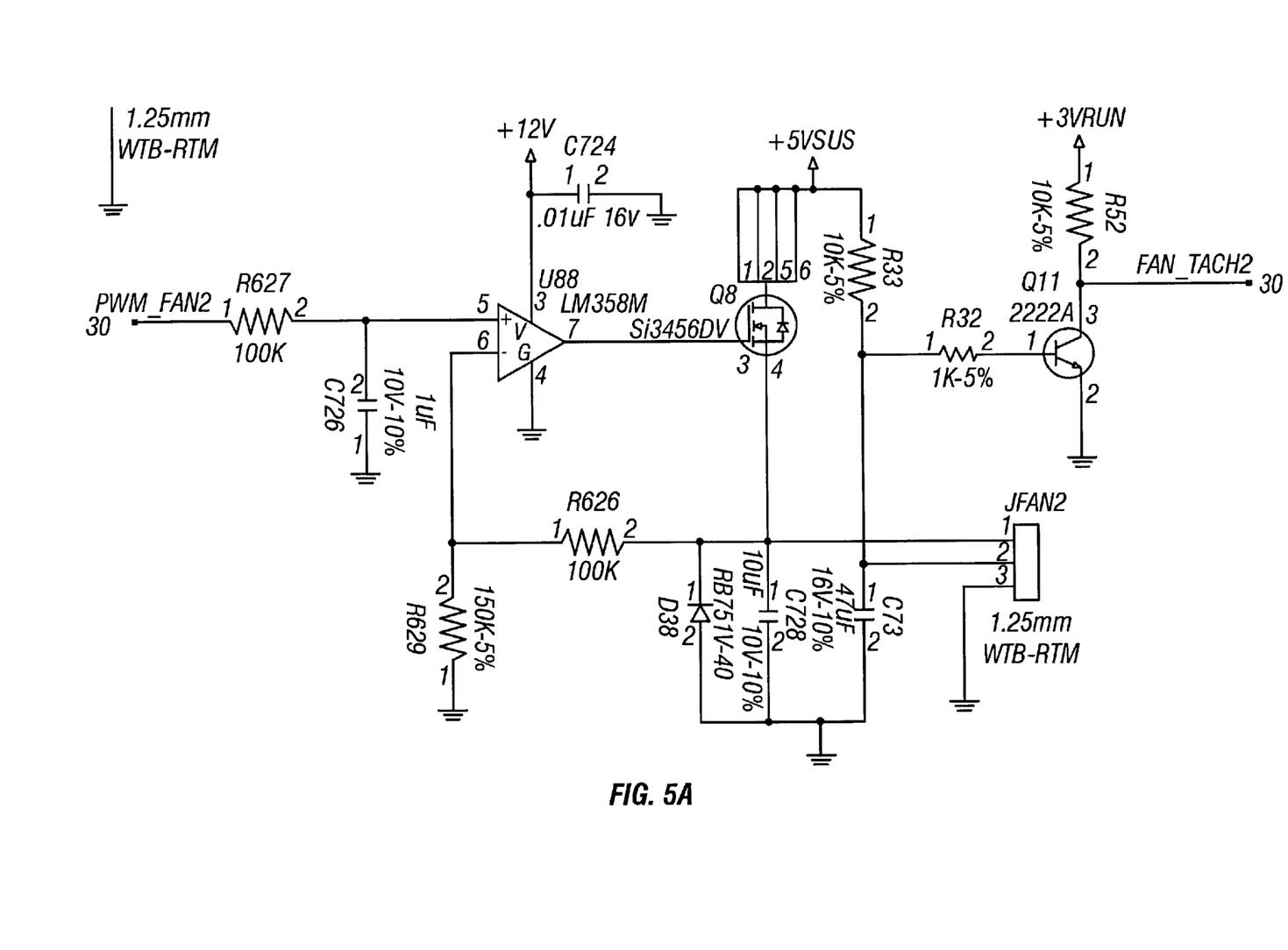
FIGS. 5A and 5B are circuit diagrams of integrator circuits according to one embodiment of the invention.
Figure 5B:
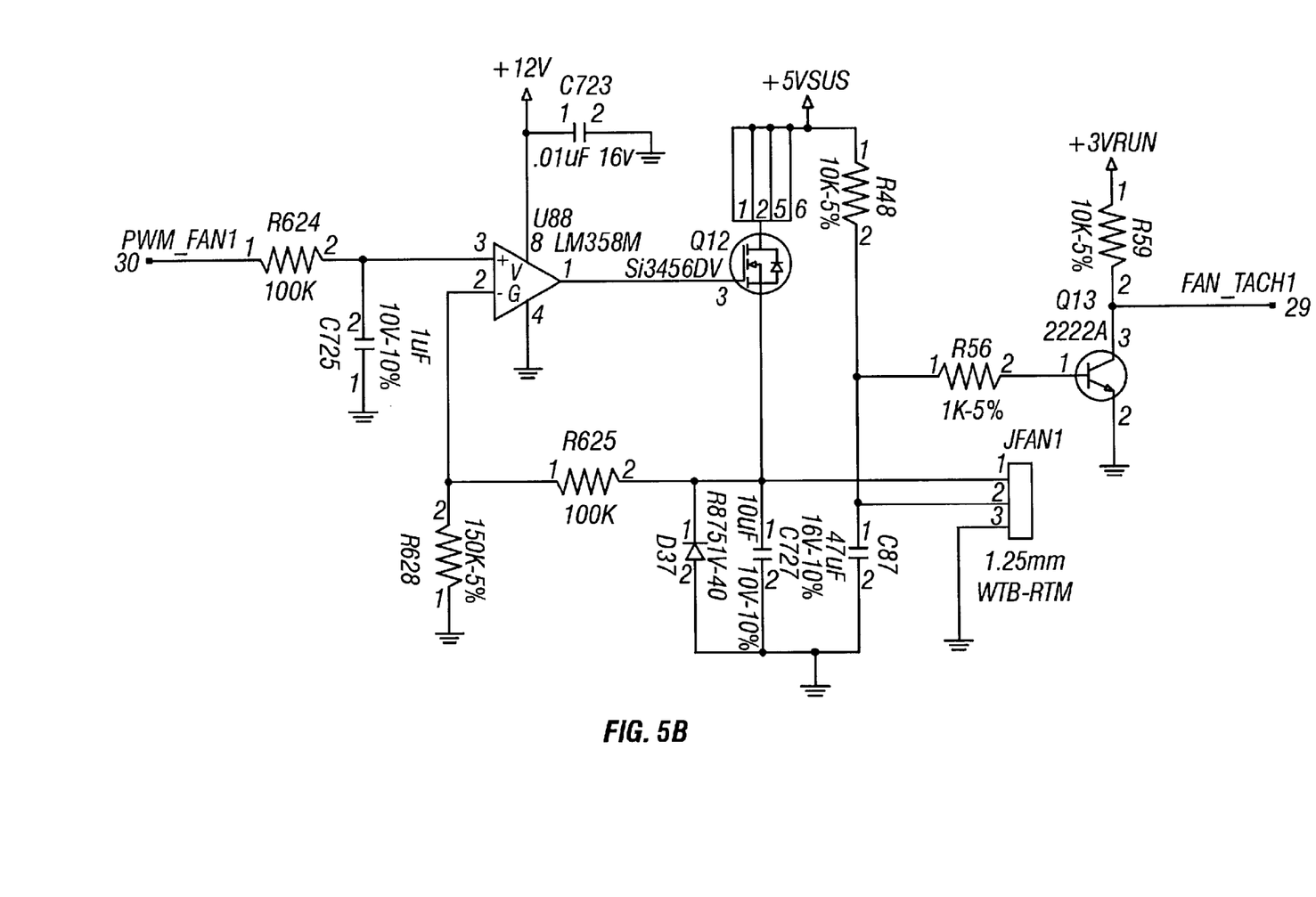

FIG. 5A is a circuit diagram of integrator circuit 335 according to one embodiment of the invention. As shown in FIG. 5A, integrator circuit 335 receives pwm 380 from controller 287 (previously shown in FIG. 3). Integrator circuit 335 sends tachometer 331 signal to controller 287. As shown in FIG. 5A, integrator circuit 335 sends a signal to fan 330 (as shown in FIG. 3). FIG. 5B is a circuit diagram of integrator circuit 345 of one embodiment of the invention. As shown in FIG. 5B, integrator circuit 345 receives pwm 390 from controller 287. Integrator circuit 345 sends tachometer 341 signal to controller 287. As shown in FIG. 5B, integrator circuit 345 sends a signal to fan 340 (as shown in FIG. 3). Integrator circuits 335 and 345 translate pwm signals 380 and 390 from digital format to analog format. The analog signal (typically zero to five volts) is used as a power supply to fans 340 and 360. Thus, the integrator circuits provide speed control by varying the amplitude of the signal. However, the integrator circuits shown in FIGS. 5A and 5B are examples only and are not limiting. Other circuits to translate the digital signal to an analog signal may be used. Alternatively, the fans may be controlled without use of an integrator circuit as shown previously in FIG. 2B.

The method disclosed is not restricted to a specific software, software language or software architecture. Each of the steps of the method disclosed may be performed by a module (e.g., a software module) or a portion of a module executing on a computer system. Thus, the above component organization may be executed on a laptop computer (as previously shown in FIG. 2A) or a desk top computer system. The method may be embodied in a machine-readable and/or computer-readable medium for configuring a computer system to execute the method. Thus, the software modules may be stored within and/or transmitted to a computer system memory to configure the computer system to perform the functions of the module.

The operations described above and modules therefor may be executed on a computer system configured to execute the operations of the method and/or may be executed from computer-readable media. The method may be embodied in a machine-readable and/or computer-readable medium for configuring a computer system to execute the method.

While particular embodiments of the present invention have been shown and described, it will be obvious to those skilled in the art that, based upon the teachings herein, changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims.

What is claimed is:

1. A computer system, comprising:
   a central processing unit ("cpu");
   a first cooling fan;
   a second cooling fan;
   a controller coupled to the cpu and to the first and the second cooling fan, the controller having an input for receiving a temperature signal indicative of a temperature of the cpu, a first output for providing a first control signal to the first fan, and a second output for providing a second control signal to the second fan, wherein the controller operates to sequentially:
   start the first fan;
   stop the first fan;
   start the second fan;
   stop the second fan; and
   start the first fan.

2. The computer system as recited in claim 1, further comprising:
   a temperature sensor coupled to the cpu for providing a temperature signal to the controller; and
   a basic input/output operating system (bios), the bios further comprising:
   a thermal table, the thermal table identifying a temperature at which the first control signal is sent from the controller to the first cooling fan.

3. The computer system as recited in claim 2, wherein the thermal table further identifies a temperature at which a stop signal is sent from the controller to the first cooling fan.

4. The computer system as recited in claim 1, further comprising:
   a temperature sensor coupled to the cpu for providing a cpu temperature signal to the controller; and
   a set of software instructions stored in a memory of the computer system effective to identify a temperature at which the first control signal is sent from the controller to the first cooling fan.

5. The computer system as recited in claim 4, wherein a thermal table further identifies a temperature at which a stop signal is sent from the controller to the first cooling fan.

6. The computer system as recited in claim 1, wherein the controller sends a speed signal to the first cooling fan, the speed signal controlling the speed of the first cooling fan to a first speed, wherein the first cooling fan operating at the first speed produces less noise than the first cooling fan operating at a second speed.

7. In a computer system, a method of operating at least a first cooling fan and a second cooling fan, so as to more evenly distribute the running time of the fans, the method comprising:
   coupling a temperature sensor to a central processing unit ("cpu");
   coupling a temperature control signal from the temperature sensor to an input of a fan controller;
   coupling a first fan control output of the fan controller to the first fan;
   coupling a second fan control output of the fan controller to the second fan; and
   causing the controller to operate so as to sequentially:
   start the first fan;
   stop the first fan;
   start the second fan;
   stop the second fan; and
   start the first fan.

8. The method as recited in claim 7, further comprising:
   storing a basic input/output operating system (bios) in a memory of the computer system; and
   the bios further comprising a thermal table, the thermal table identifying a first temperature at which a first start signal is sent to the first cooling fan.

9. The method as recited in claim 8, wherein the thermal table identifies a second temperature at which a first stop signal is sent to the first cooling fan.

10. The method as recited in claim 9, wherein the thermal table identifies a third temperature at which a second start signal is sent to the second cooling fan.

11. The method as recited in claim 8, wherein the thermal table identifies a first temperature and a first speed, wherein a first integrator circuit sends a first speed signal to the first cooling fan.

12. The method as recited in claim 11, wherein the thermal table identifies a second temperature and a second speed, a second integrator circuit sends a second speed signal to the second cooling fan, the second speed signal identifies a second operating speed for the second cooling fan, wherein the first cooling fan operating at the first speed and the second cooling fan operating at the second speed produces less noise than the first cooling fan operating at a speed higher than the first speed.

13. An electronic system, comprising:
a central processing unit ("cpu");
a first cooling fan;
a second cooling fan;
a controller coupled to the cpu and to the first and the second cooling fan, the controller having an input for receiving a temperature signal indicative of a temperature of the cpu, a first output for providing a first control signal to the first fan, and a second output for providing a second control signal to the second fan, wherein the controller operates to sequentially:
start the first fan;
stop the first fan;
start the second fan;
stop the second fan; and
start the first fan.

14. The electronic system as recited in claim 13, further comprising:
a temperature sensor coupled to the cpu for providing a temperature signal to the controller; and
a basic input/output operating system (bios), the bios further comprising:
a thermal table, the thermal table identifying a temperature at which the first control signal is sent from the controller to a first cooling fan.

15. The electronic system as recited in claim 14, wherein the thermal table further identifies a temperature at which a stop signal is sent from the controller to the first cooling fan.

16. The electronic system as recited in claim 14, wherein the thermal table further identifies a temperature at which the first control signal is sent to the second cooling fan.

17. The electronic system as recited in claim 14, wherein the thermal table further identifies a temperature at which a stop signal is sent to the second cooling fan.

18. The electronic system as recited in claim 14, wherein the thermal table identifies a temperature at which a first signal is sent to the first cooling fan for the first cooling fan to operate at a first speed, the first speed is less than a second speed, wherein the first cooling fan operating at the first speed produces less noise than operating at the second speed.

19. A computer system, comprising:
a cpu,
a memory operably coupled to the cpu;
a first cooling fan;
a second cooling fan;
a controller coupled to the first cooling fan and the second cooling fan; and
means for alternating operation of the first cooling fan and the second cooling fan.

20. The computer system as recited in claim 19, further comprising:
means for operating the first cooling fan at a first speed, wherein the first speed is less than a second speed, wherein operating the first cooling fan at the first speed increases the operating life of the first cooling fan.

21. The computer system as recited in claim 19, further comprising:
means for operating the first cooling fan at a first speed to increase the reliability of the computer system.

22. The computer system as recited in claim 19, further comprising:
means for operating the first cooling fan at a first speed and means to operate the second cooling fan at a second speed to reduce noise produced by the first cooling fan operating at a third speed.

23. The computer system as recited in claim 19, further comprising:
means for operating the first cooling fan and the second cooling fan in response to information related to a temperature of the cpu.

24. A computer program product encoded in computer readable media, comprising:
a set of instructions configured to alternate operation of a first cooling fan and a second cooling fan.

25. The computer program product as recited in claim 24, further comprising:
a set of instructions configured to control a speed of operation of the first cooling fan to increase the reliability of an electronic system.

26. The computer program product as recited in claim 24, further comprising:
a set of instructions configured to reduce the operating frequency of a cpu, the reduction in operating frequency of the cpu reducing heat generated by the cpu.

* * * * *